US012757699B2

(12) United States Patent
Ke

(10) Patent No.: US 12,757,699 B2
(45) Date of Patent: Oct. 6, 2026

(54) SEMICONDUCTOR MEMORY DEVICE MANUFACTURING METHOD

(71) Applicant: NANYA TECHNOLOGY CORPORATION, New Taipei city (TW)

(72) Inventor: Chin-Chung Ke, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 355 days.

(21) Appl. No.: 18/438,502

(22) Filed: Feb. 11, 2024

(65) Prior Publication Data

US 2025/0259893 A1 Aug. 14, 2025

(51) Int. Cl.

| | |
|---|---|
| ***H01L 21/768*** | (2006.01) |
| ***H10P 14/60*** | (2026.01) |
| ***H10W 20/00*** | (2026.01) |

(52) U.S. Cl.

CPC ....... *H10W 20/056* (2026.01); *H10P 14/6339* (2026.01); *H10W 20/076* (2026.01); *H10W 20/089* (2026.01)

(58) Field of Classification Search

CPC ............. H10W 20/056; H10W 20/076; H10W 20/089; H10P 14/6339

See application file for complete search history.

(56) References Cited

U.S. PATENT DOCUMENTS

| | | | | |
|---|---|---|---|---|
| 2010/0210105 A1* | 8/2010 | Baek | .................... | H10B 12/488 438/653 |
| 2019/0164977 A1* | 5/2019 | Lin | ...................... | H10B 12/053 |
| 2021/0066466 A1* | 3/2021 | Kwon | .................. | H10D 64/513 |

FOREIGN PATENT DOCUMENTS

| | | |
|---|---|---|
| CN | 103515310 A | 1/2014 |
| TW | 202336870 A | 9/2023 |

* cited by examiner

*Primary Examiner* — Mohammed R Alam

(74) *Attorney, Agent, or Firm* — CKC & Partners Co., LLC

(57) ABSTRACT

A semiconductor memory device manufacturing method includes the following steps. A word line trench is formed in an active area of a substrate. An oxide liner is formed in the word line trench such that the word line trench has a first width at a first opening of the word line trench after forming the oxide liner. A word line metal is formed in the word line trench. A nitride layer is formed over the active area of the substrate. The nitride layer is patterned to form a second opening that is communicable with the first opening of the word line trench, wherein the second opening has a second width greater than the first width.

20 Claims, 4 Drawing Sheets

SEMICONDUCTOR MEMORY DEVICE MANUFACTURING METHOD

BACKGROUND

Field of Disclosure

The present disclosure relates to a semiconductor memory device and manufacturing method thereof.

Description of Related Art

An integrated circuit (IC) device (also referred to as a semiconductor chip) can contain millions of transistors and other circuit elements that are fabricated on a single silicon crystal substrate (wafer). In a semiconductor memory device, a word line is a conductor that connects and controls the access to a row of memory cells. Its function is to enable or disable the transfer of data between the memory cells and the bit lines during read or write operations. Essentially, the word line selects a specific row of memory cells, allowing the activation or deactivation of those cells for data manipulation.

SUMMARY

The present disclosure provides semiconductor memory device manufacturing methods to deal with the needs of the prior art problems.

In one or more embodiments, a semiconductor memory device manufacturing method including: forming a word line trench in an active area of a substrate; forming an oxide liner in the word line trench such that the word line trench has a first width at a first opening of the word line trench after forming the oxide liner; forming a word line metal in the word line trench; forming a nitride layer over the active area of the substrate; and patterning the nitride layer to form a second opening that is communicable with the first opening of the word line trench, wherein the second opening has a second width greater than the first width.

In one or more embodiments, the word line metal is copper.

In one or more embodiments, the word line metal is tungsten.

In one or more embodiments, the second opening and the word line trench collectively have a trapezoidal profile.

In one or more embodiments, the second width is 1.3-1.6 times greater than the first width.

In one or more embodiments, the first width ranges from 15 nanometers to 24 nanometers.

In one or more embodiments, the second width ranges from 20 nanometers to 32 nanometers.

In one or more embodiments, the method further includes: forming an atomic-layer-deposition conformal oxide layer in the word line trench and over the first, second openings and the nitride layer.

In one or more embodiments, the method further includes: etching the atomic-layer-deposition conformal oxide layer to remove portions over the second opening and the nitride layer.

In one or more embodiments, the method further includes: forming a nitride material in the word line trench until the second opening is fully filled.

In one or more embodiments, a semiconductor memory device manufacturing method including: forming a word line trench in an active area of a substrate; forming an oxide liner in the word line trench such that the word line trench has a first width at a first opening of the word line trench after forming the oxide liner; forming a word line metal in the word line trench; forming a diffusion barrier to wrap the word line metal; forming a conductive layer in the word line trench and above the word line metal; forming a nitride layer over the active area of the substrate; and patterning the nitride layer to form a second opening that is communicable with the first opening of the word line trench, wherein the second opening has a second width greater than the first width.

In one or more embodiments, the word line metal is copper or tungsten.

In one or more embodiments, the conductive layer is polysilicon.

In one or more embodiments, the second opening and the word line trench collectively have a trapezoidal profile.

In one or more embodiments, the second width is 1.3-1.6 times greater than the first width.

In one or more embodiments, the first width ranges from 15 nanometers to 24 nanometers.

In one or more embodiments, the second width ranges from 20 nanometers to 32 nanometers.

In one or more embodiments, the method further includes: forming an atomic-layer-deposition conformal oxide layer in the word line trench and over the first, second openings and the nitride layer.

In one or more embodiments, the method further includes: etching the atomic-layer-deposition conformal oxide layer to remove portions over the second opening and the nitride layer.

In one or more embodiments, the method further includes: forming a nitride material in the word line trench until the second opening is fully filled.

In sum, the semiconductor memory device manufacturing method disclosed herein utilizes a word line trench with a trapezoidal profile to restrict the remained portions of the conformal oxide layer and the oxide liner in the word line trench and forms a trapezoidal-profiled nitride material to protect the remained portions of the conformal oxide layer and the oxide liner from further etch.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
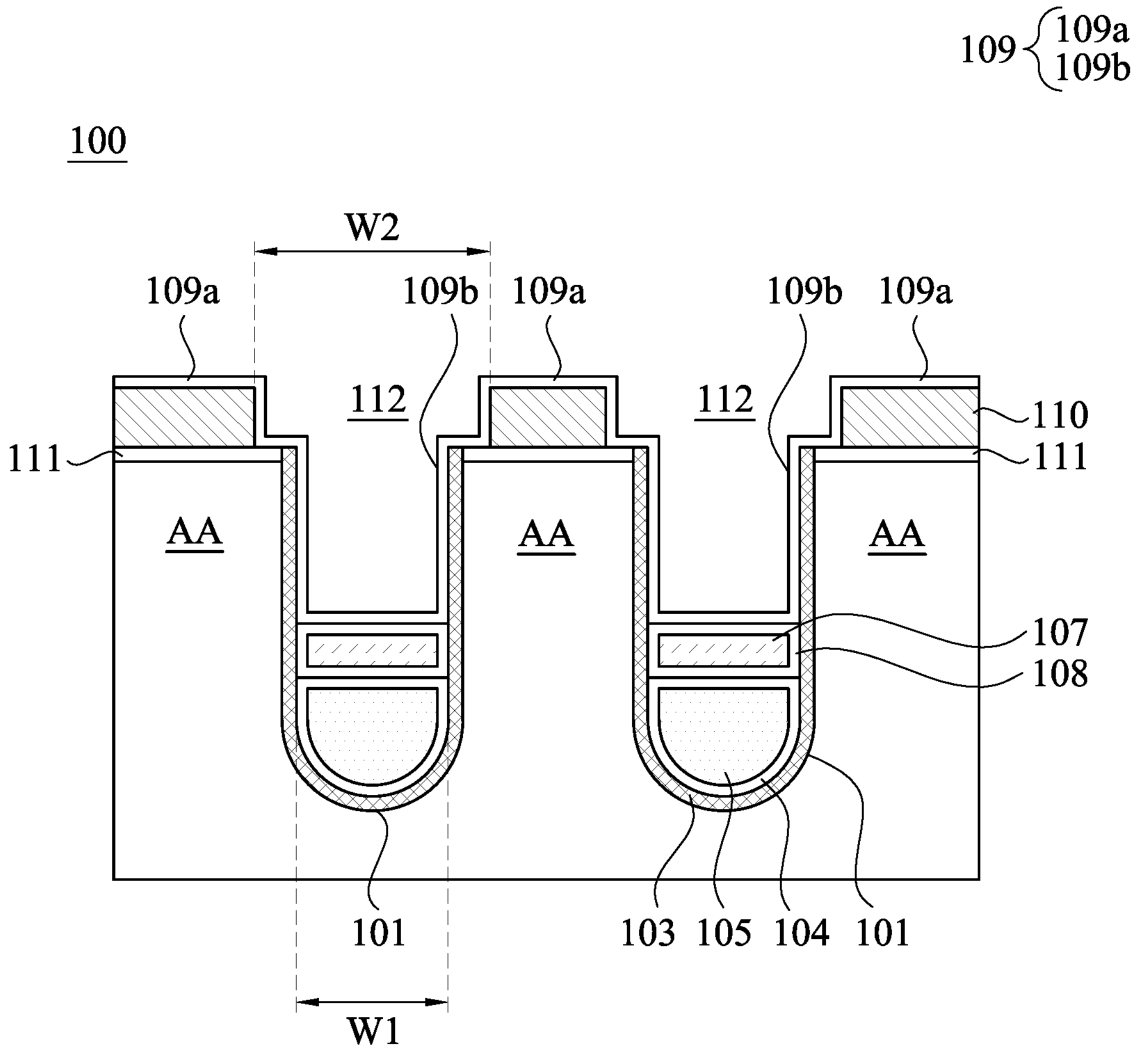
FIGS. 1-3 illustrate cross-sectional views of several steps of a semiconductor memory manufacturing process according to some embodiments of the present disclosure.
Figure 2:
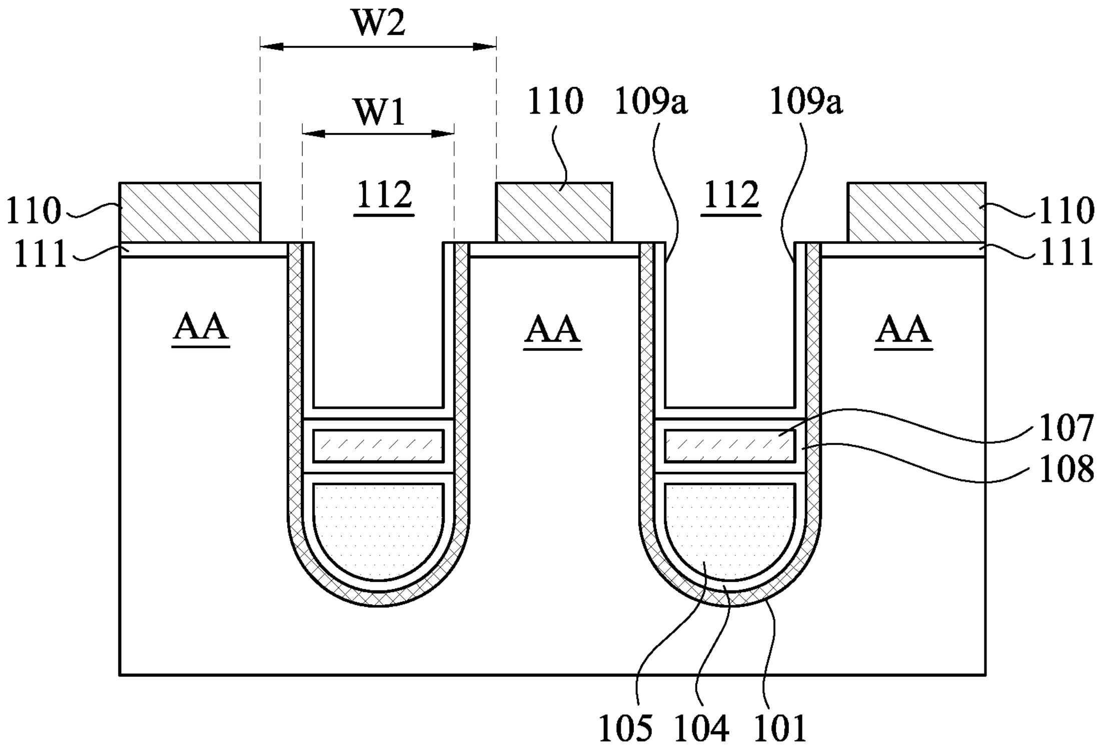
Figure 3:
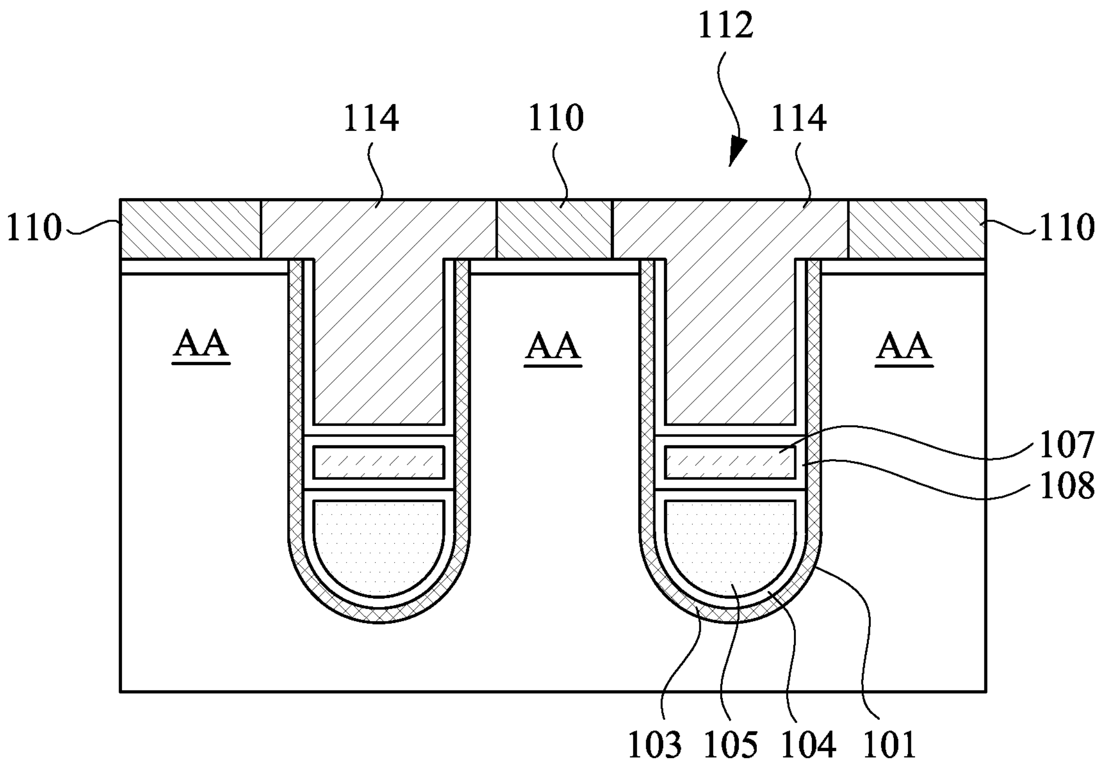

Reference will now be made in detail to the present embodiments of the disclosure, examples of which are illustrated in the accompanying drawings. Wherever possible, the same reference numbers are used in the drawings and the description to refer to the same or like parts.

Figure 4:
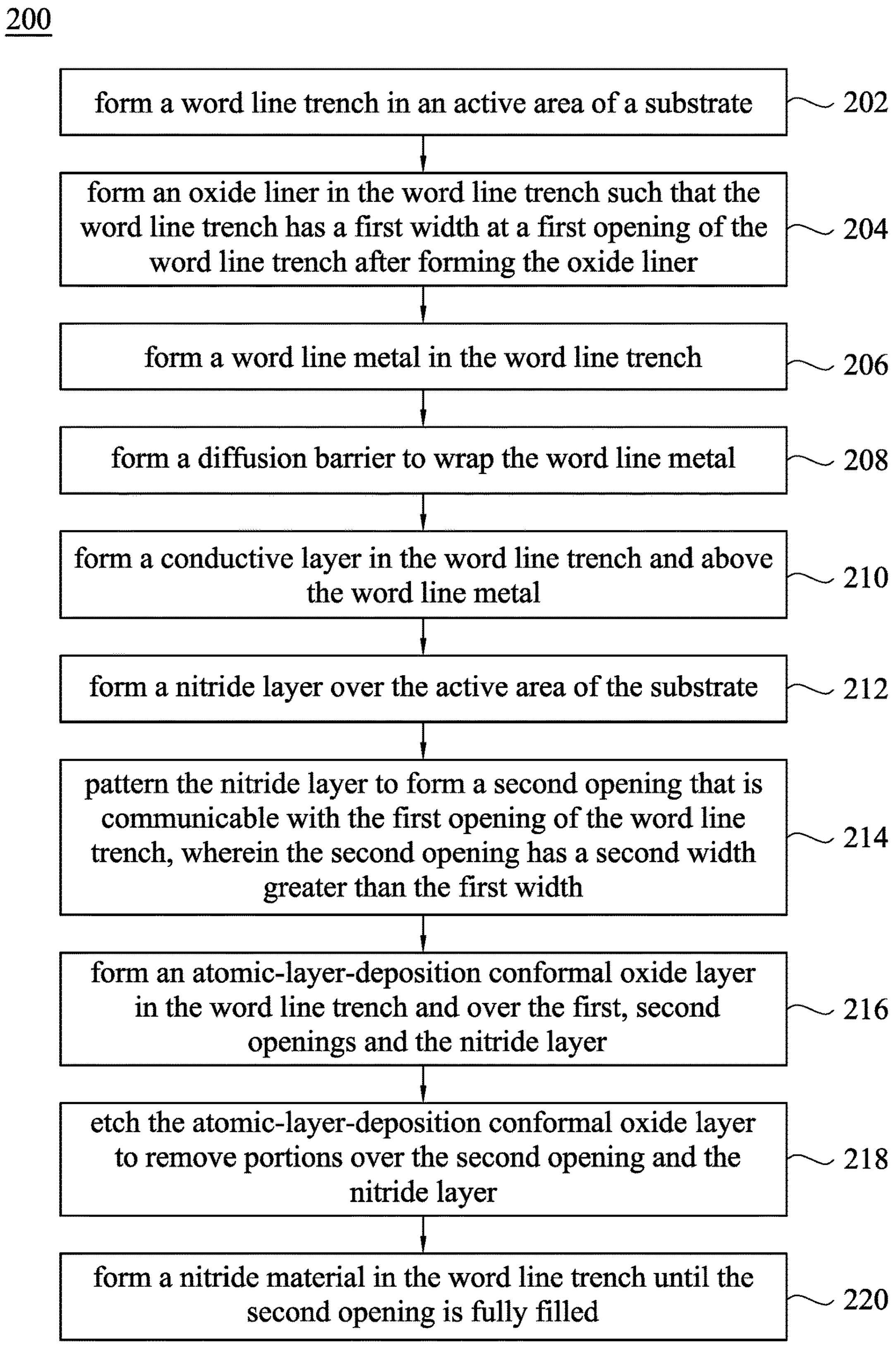
FIG. 4 illustrates a flowchart of several steps of a semiconductor memory manufacturing process according to some embodiments of the present disclosure.

Reference is made to FIGS. 1-4, FIGS. 1-3 illustrate cross-sectional views of several steps of a semiconductor memory manufacturing process according to some embodiments of the present disclosure, and FIG. 4 illustrates a flowchart of several steps of a semiconductor memory manufacturing process 200 according to some embodiments of the present disclosure. The cross-sectional view illustrates a portion of a memory array 100 including word line structures. A semiconductor substrate is processed to form active areas AA. Several steps are typically involved in semiconductor processing. A suitable semiconductor substrate, such as silicon (Si), is chosen based on the desired device specifications and requirements. A thin layer of silicon dioxide ($SiO_2$) may be on the surface of the substrate. This can be achieved through thermal oxidation, where the substrate is exposed to an oxygen-rich environment at high temperatures, or by using deposition techniques such as chemical vapor deposition (CVD) or plasma-enhanced chemical vapor deposition (PECVD). A layer of photosensitive material, known as photoresist, is coated onto the oxide layer. Then, expose the photoresist to ultraviolet (UV) light through a photomask containing the desired pattern. This step transfers the pattern onto the photoresist. The exposed photoresist is developed using a suitable developer solution. This selectively removes either the exposed (positive photoresist) or unexposed (negative photoresist) regions of the photoresist, leaving behind the desired pattern. An etching process, such as plasma etching or wet etching, is used to selectively remove the exposed oxide layer where the active area will be formed. The patterned photoresist acts as a mask, protecting the regions where the oxide is desired. Ion implantation is performed to introduce p-type or n-type dopant atoms into the exposed semiconductor substrate regions where the active devices will be formed. The dopants modify the electrical properties of the substrate, creating regions with desired conductivity characteristics. The implanted dopants are activated and crystal lattice damage caused by the implantation process is repaired through an annealing process. This step typically involves subjecting the substrate to high temperatures for a specific duration.

In step 202 of the process 200, a word line trench 101 is formed in an active area AA of a substrate. Forming a word line trench 101 may involve a series of semiconductor fabrication steps. Apply A layer of photoresist may be applied on top of the active area AA of a substrate. The photoresist can be exposed to ultraviolet light through a photomask. The photomask has a pattern that defines the location of the word line trench. The photoresist can be developed to remove the exposed or unexposed portions based on the UV light exposure. A chemical etchant may be used to remove the exposed insulating layer, creating openings for the word line trench 101. Perform A dry or wet etching process is performed to create the trench 101 in the active area AA where the word line will be formed.

In step 204 of the process 200, an oxide liner 103 is formed in the word line trench 101 such that the word line trench has a first width W1 at a first opening of the word line trench after forming the oxide liner 103. In one or more embodiments, the oxide liner 103 can be formed using an in situ steam generation (ISSG) process. An inner sidewall of the word line trench 101 can be exposed to steam under controlled conditions. This process often involves heating the memory array 100 in the presence of steam, allowing the water vapor to react with the surface, forming the oxide liner 103. In one or more embodiments, the first width W1 ranges from 15 nanometers to 24 nanometers.

In step 206 of the process 200, a word line metal 105 can be formed at a bottom in the word line trench 101. In one or more embodiments, the word line metal 105 can be copper or tungsten. The word line metal 105 can be formed by an electroplating process. For example, a thin layer of metal, typically copper or tungsten, called the seed layer can be applied at the bottom of the word line trench 101. An electroplating process can be used to deposit a thicker layer of copper or tungsten onto the seed layer. This builds up the metal in the trench, forming the desired structure. A chemical mechanical polishing (CMP) may be performed to remove excess metal. The wafer substrate may be subjected to annealing, a heat treatment process, to enhance the properties of the deposited metal and improve its electrical conductivity.

In step 208 of the process 200, a diffusion barrier 104 can be formed to wrap the word line metal 105. This step may be formed before and after depositing the word line metal 105. Forming the diffusion barrier 104 around the word line metal 105 is configured to prevent the unwanted diffusion of materials between different layers in semiconductor manufacturing. This is crucial to maintain the integrity and functionality of the device. A suitable material may be chosen with excellent diffusion barrier properties, such as tantalum (Ta), tantalum nitride (TaN), or titanium nitride (TiN). A thin layer of this material can be deposited evenly over the word line metal 105. The diffusion barrier serves several crucial purposes including preventing diffusion and adhesion. The diffusion barrier 104 acts as a barrier to prevent the migration of atoms from one layer to another. Without it, materials could diffuse into each other, causing unwanted chemical reactions and compromising device performance. The diffusion barrier 104 also enhances adhesion between different materials, ensuring a stable and reliable structure. Lithography and etching processes may be employed to define and pattern the diffusion barrier layer, ensuring precise alignment and coverage. The diffusion barrier 104 may serve as an integral part of the multilayered structure in semiconductor devices, preventing issues like electromigration and ensuring the longevity and reliability of the device.

In step 210 of the process 200, a conductive layer 107 can be formed in the word line trench 101 and above the word line metal 105. In one or more embodiments, the conductive layer 107 can be polysilicon. A dielectric layer 108, often oxide, may be deposited into the word line trench 101 to insulate the subsequent polysilicon layer from the word line metal 105. A chemical vapor deposition (CVD) can be used to deposit a layer of polysilicon (conductive material) into the word line trench 101 and above the word line metal (105). A chemical mechanical polishing (CMP) may be performed to remove excess polysilicon. The wafer substrate may be subjected to annealing, a heat treatment process, to its enhance conductivity and structural integrity.

In step 212 of the process 200, a nitride layer 110 is formed over the active area AA of the substrate. A deposition method, often chemical vapor deposition (CVD) or physical vapor deposition (PVD), can be utilized to deposit a layer of nitride (usually silicon nitride, $Si_3N_4$) onto the active area AA of the substrate.

In step 214 of the process 200, the nitride layer 110 can be patterned to form a second opening 112 that is communicable with the first opening of the word line trench 101, wherein the second opening 112 has a second width W2 greater than the first width W1. Lithography techniques can be applied to pattern the nitride layer 110. This involves using a photoresist and exposing it to light through a mask with the desired pattern, followed by developing and etching to define the areas where the nitride layer will remain. In one or more embodiments, the second opening 112 and the word line trench 101 collectively have a trapezoidal profile. In one or more embodiments, the second width W2 ranges from 20 nanometers to 32 nanometers. In one or more embodiments, the second width W2 is 1.3-1.6 times greater than the first width W1.

In step 216 of the process 200, an atomic-layer-deposition conformal oxide layer 109 can be formed in the word line trench 101 and over the first, second openings and the nitride layer 110. An atomic layer deposition (ALD) is used to deposit a conformal oxide layer 109. ALD is a cyclic deposition process where precursor gases are introduced sequentially, forming one atomic layer at a time on the substrate surface. Precursor gases (often metal precursors and oxidizers) are introduced alternately in a cyclic fashion. These precursors react with the substrate surface in a self-limiting manner, forming a monolayer of oxide in each cycle. ALD provides excellent conformality, ensuring a uniform and controlled oxide layer even in complex structures like word line trenches and openings. The ALD process allows precise coverage over the nitride layer 110 and other surfaces, creating a consistent and conformal oxide layer. Continue the ALD cycles until the desired thickness of the oxide layer is achieved. The conformal oxide layer 109 includes portions 109*a* covering the second opening 112 and the nitride layer 110 and portions 109*b* within the word line trench 101.

In step 218 of the process 200, the conformal oxide layer 109 is etched to remove portions 109*a* over the second opening 112 and the nitride layer 110 and the portions 109*b* are remained within the word line trench 101. A proper etching process, e.g., a dry etching, is used until the portions 109*a* are removed to exposed an underneath etch stop layer 111. When the etch stop layer 111 is exposed, the etching process will be ended.

In step 220 of the process 200, a nitride material 114 is formed in the word line trench 101 until the second opening 112 is fully filled. The nitride material 114 has a trapezoidal profile that is configured to cover and protect the remained portions 109*b* of the conformal oxide layer 109 and the oxide liner 103 from being etched by a subsequent etching process.

In a subsequent step of the process 200, a bit line metal can be formed above the nitride material 114. The trapezoidal-profiled nitride material 114 effectively prevents a short circuit between the bit line metal and the active areas AA of the substrate.

In sum, the semiconductor memory device manufacturing method disclosed herein utilizes a word line trench with a trapezoidal profile to restrict the remained portions of the conformal oxide layer and the oxide liner in the word line trench and forms a trapezoidal-profiled nitride material to protect the remained portions of the conformal oxide layer and the oxide liner from further etch.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor memory device manufacturing method comprising:

forming a word line trench in an active area of a substrate;

forming an oxide liner in the word line trench such that the word line trench has a first width at a first opening of the word line trench after forming the oxide liner;

forming a word line metal in the word line trench;

forming a nitride layer over the active area of the substrate; and patterning the nitride layer to form a second opening that is communicable with the first opening of the word line trench, wherein the patterned nitride layer is above the word line trench and spaced from the oxide liner, the second opening has a second width that is defined between sidewalls of the patterned nitride layer, and the second width is greater than the first width.

2. The method of claim 1, wherein the word line metal comprises copper.

3. The method of claim 1, wherein the word line metal comprises tungsten.

4. The method of claim 1, wherein the second opening and the word line trench collectively have a trapezoidal profile.

5. The method of claim 1, wherein the second width is 1.3-1.6 times greater than the first width.

6. The method of claim 1, wherein the first width ranges from 15 nanometers to 24 nanometers.

7. The method of claim 6, wherein the second width ranges from 20 nanometers to 32 nanometers.

8. The method of claim 1 further comprising: forming an atomic-layer-deposition conformal oxide layer in the word line trench and over the first, second openings and the nitride layer.

9. The method of claim 8 further comprising: etching the atomic-layer-deposition conformal oxide layer to remove portions over the second opening and the nitride layer.

10. The method of claim 9 further comprising: forming a nitride material in the word line trench until the second opening is fully filled.

11. A semiconductor memory device manufacturing method comprising:

forming a word line trench in an active area of a substrate;

forming an oxide liner in the word line trench such that the word line trench has a first width at a first opening of the word line trench after forming the oxide liner;

forming a word line metal in the word line trench;

forming a diffusion barrier to wrap the word line metal;

forming a conductive layer in the word line trench and above the word line metal;

forming a nitride layer over the active area of the substrate; and patterning the nitride layer to form a second opening that is communicable with the first opening of the word line trench, wherein the patterned nitride layer is above the word line trench and spaced from the oxide liner, the second opening has a second width that is defined between sidewalls of the patterned nitride layer, and the second width is greater than the first width.

12. The method of claim 11, wherein the word line metal comprises copper or tungsten.

13. The method of claim 11, wherein the conductive layer comprises polysilicon.

14. The method of claim 11, wherein the second opening and the word line trench collectively have a trapezoidal profile.

15. The method of claim 11, wherein the second width is 1.3-1.6 times greater than the first width.

16. The method of claim 11, wherein the first width ranges from 15 nanometers to 24 nanometers.

17. The method of claim 16, wherein the second width ranges from 20 nanometers to 32 nanometers.

18. The method of claim 11 further comprising: forming an atomic-layer-deposition conformal oxide layer in the word line trench and over the first, second openings and the nitride layer.

19. The method of claim 18 further comprising: etching the atomic-layer-deposition conformal oxide layer to remove portions over the second opening and the nitride layer.

20. The method of claim 19 further comprising: forming a nitride material in the word line trench until the second opening is fully filled.

* * * * *